US012534779B2

(12) United States Patent
Zhang et al.

(10) Patent No.: US 12,534,779 B2
(45) Date of Patent: Jan. 27, 2026

(54) NICKEL-BASED SUPERALLOYS AND ARTICLES

(71) Applicant: General Electric Company, Schenectady, NY (US)

(72) Inventors: Wei-Jun Zhang, Mason, OH (US); Douglas Gerard Konitzer, West Chester, OH (US)

(73) Assignee: General Electric Company, Evendale, OH (US)

( * ) Notice: Subject to any disclaimer, the term of this patent is extended or adjusted under 35 U.S.C. 154(b) by 38 days.

(21) Appl. No.: 17/737,458

(22) Filed: May 5, 2022

(65) Prior Publication Data

US 2023/0357896 A1 Nov. 9, 2023

(51) Int. Cl.
*C22C 19/05* (2006.01)
*C30B 29/52* (2006.01)

(52) U.S. Cl.
CPC ............ *C22C 19/056* (2013.01); *C30B 29/52* (2013.01)

(58) Field of Classification Search
CPC ........ C22C 19/056; C22C 19/057; C22F 1/10
See application file for complete search history.

(56) References Cited

U.S. PATENT DOCUMENTS

| | | | |
|---|---|---|---|
| 4,719,080 | A | 1/1988 | Duhl et al. |
| 5,061,154 | A | 10/1991 | Kington |
| 5,151,249 | A | 9/1992 | Austin et al. |
| 5,270,123 | A | 12/1993 | Walston et al. |
| 5,549,765 | A | 8/1996 | Mihalisin et al. |
| 5,759,303 | A | 6/1998 | Mihalisin et al. |
| 6,007,645 | A | 12/1999 | Cetel et al. |
| 6,074,602 | A | 6/2000 | Wukusick et al. |
| 6,416,596 | B1 | 7/2002 | Wood et al. |
| 6,419,763 | B1 | 7/2002 | Konter et al. |
| 6,444,057 | B1 | 9/2002 | Darolia et al. |
| 7,306,682 | B2 | 12/2007 | Yoshinari et al. |
| 8,216,509 | B2 | 7/2012 | Strangman |
| 8,858,876 | B2 | 10/2014 | Zhang et al. |
| 9,593,583 | B2 | 3/2017 | Walker et al. |
| 10,280,486 | B2 | 5/2019 | Zhang et al. |
| 2003/0075247 | A1 | 4/2003 | Koizumi et al. |
| 2004/0033156 | A1 | 2/2004 | Caron et al. |
| 2004/0229072 | A1 | 11/2004 | Murphy |
| 2005/0194068 | A1 | 9/2005 | Caron et al. |
| 2011/0143164 | A1 | 6/2011 | Cetel et al. |

FOREIGN PATENT DOCUMENTS

| | | | |
|---|---|---|---|
| CN | 101790593 | A | 7/2010 |
| CN | 103436739 | A | 12/2013 |
| CN | 113376015 | A | 9/2021 |
| EP | 1038982 | A1 | 9/2000 |
| GB | 2235697 | A | 3/1991 |
| GB | 2268937 | A | 1/1994 |
| WO | WO2015/181549 | A1 | 12/2015 |

OTHER PUBLICATIONS

Li et al., A Low-Cost Second Generation Single Crystal Superalloy DDG, Superalloys 2000, Beijing Institute of Aeronautical Materials, 2000, pp. 773-783. https://www.tms.org/Superalloys/10.7449/2000/Superalloys_2000_777_783.pdf.

*Primary Examiner* — Jessee R Roe
(74) *Attorney, Agent, or Firm* — Dority & Manning, P.A.

(57) ABSTRACT

A nickel-based superalloy composition is provided that includes 6.1 wt. % to 6.6 wt. % aluminum; 5.6 wt. % to 6.6 wt. % tantalum; 9.0 wt. % to 11.0 wt. % chromium; 5.5 wt % to 6.2 wt. % tungsten; 1.1 wt. % to 1.4 wt % molybdenum; 2.0 wt. % to 2.6 wt % rhenium; 5.5 wt. % to 10.0 wt % cobalt; 0.2 wt % to 0.5 wt % hafnium; up to 0.05 wt % carbon; 0.002 wt % to 0.01 wt % boron; and a balance of nickel and incidental impurities, wherein the composition exhibits a rupture life that is greater than 40 hours at 982.2° C. and 40 ksi, and wherein the composition exhibits a corrosion resistance of less than 50.8 μm attack at 926.7° C. after a 940 hour burner rig test. Components are also provided formed from the composition.

19 Claims, 3 Drawing Sheets

| Compositions (wt. %) | | | | | | | | | | | Rupture life (hr) | 1700F Corrosion |
|---|---|---|---|---|---|---|---|---|---|---|---|---|
| Alloy | Al | Ta | Cr | W | Mo | Re | Co | C | B | Hf | 1800F/40ksi | max attack mil @ 1700F/940 hrs |
| Exemplary Alloy 1 | 6.5 | 5.8 | 10.0 | 6.0 | 1.2 | 2.3 | 5.8 | 0.04 | 0.004 | 0.3 | 58 | 1 |
| Exemplary Alloy 2 | 6.1 | 6.5 | 10.0 | 5.5 | 1.4 | 2.5 | 10.0 | 0.04 | 0.004 | 0.4 | 43 | 0.5 |
| Comparative Alloy 1 | 6.5 | 6.5 | 10.0 | 5.5 | 1.4 | 2.5 | 10.0 | 0.04 | 0.004 | 0.4 | 19 | 2 |
| Comparative Alloy 2 | 6.5 | 5.5 | 4.0 | 6.0 | 1.4 | 2.5 | 10.0 | 0.04 | 0.004 | 0.4 | 80 | 17 |
| Comparative Alloy 3 | 6.5 | 6.5 | 4.5 | 7.0 | 1.4 | 2.5 | 14.0 | 0.04 | 0.004 | 0.4 | 147 | 19 |
| Comparative Alloy 4 | 6.5 | 5.8 | 10.0 | 6.0 | 1.2 | 2.3 | 14.0 | 0.04 | 0.004 | 0.3 | 31 | 0.5 |
| Comparative Alloy 5 | 6.5 | 5.8 | 5.4 | 6.5 | 1.2 | 2.3 | 5.8 | 0.04 | 0.004 | 0.3 | 83 | 12 |
| Comparative Alloy 6 | 6.5 | 5.69 | 9.95 | 4.36 | 0.75 | 2.31 | 7.525 | 0.05 | 0.004 | 0.15 | 30 | 1 |
| Comparative Alloy 7 | 6.4 | 6.4 | 6.9 | 4.9 | 1.5 | 3.0 | 7.6 | 0.06 | 0.004 | 0.15 | 68 | 30 |
| Comparative Alloy 8 | 6.6 | 5.0 | 13.0 | 3.8 | 0.0 | 1.6 | 7.5 | 0.04 | 0.004 | 0.15 | 14 | 0.5 |

*FIG. 3*

NICKEL-BASED SUPERALLOYS AND ARTICLES

FEDERALLY SPONSORED RESEARCH

This invention was made with government support under contract number N00014-16-C-2002 awarded by the Department of Defense. The U.S. government may have certain rights in the invention.

FIELD

The present disclosure relates to a Ni-based superalloy, along with components constructed from such a Ni-based superalloy.

BACKGROUND

Nickel-based single crystal superalloys are used extensively throughout the aeroengine in turbine blade, nozzle, and shroud applications. Aeroengine designs for improved engine performance demand alloys with increasingly higher temperature capability, primarily in the form of improved creep strength (creep resistance).

BRIEF DESCRIPTION OF THE DRAWINGS

A full and enabling disclosure of the present disclosure, including the best mode thereof, directed to one of ordinary skill in the art, is set forth in the specification, which makes reference to the appended figures, in which:

FIG. 3 is a table of the chemical composition and test results of two exemplary nickel-based superalloys and eight comparative alloys, according to the Examples below.

DETAILED DESCRIPTION

Figure 1:
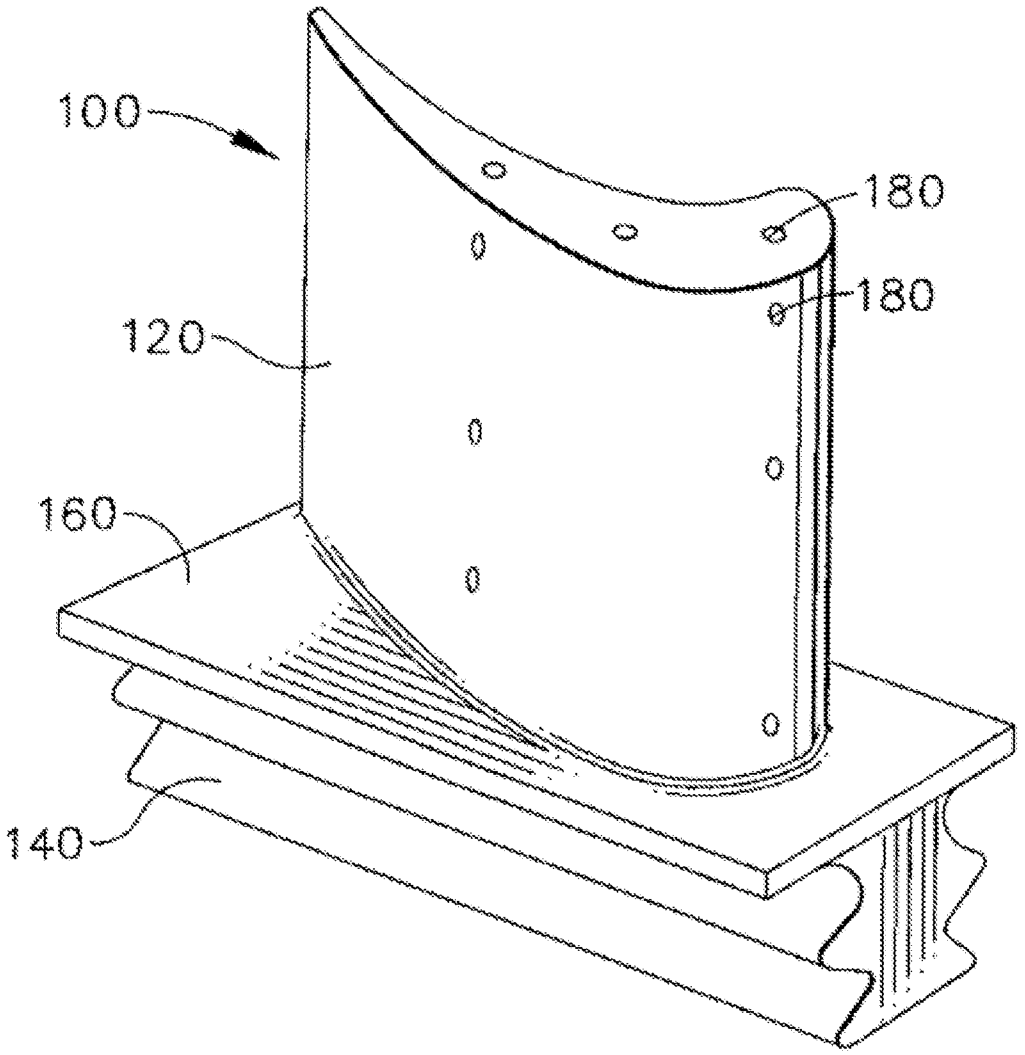
FIG. 1 is a perspective view of a component, such as a gas turbine blade, that includes an exemplary nickel-based superalloy discussed herein.

Alloys with increased amounts of solid solution strengthening elements such as Ta, W, Re, and Mo, which also provide improved creep resistance, generally exhibit decreased phase stability, increased density, and lower environmental resistance. Second generation alloys are not exceptionally strong, although they have relatively stable microstructures. Third and fourth generation alloys have improved strength due to the addition of high levels of refractory metals. For example, these alloys include high levels of tungsten, rhenium, and ruthenium. These refractory metals have densities that are much higher than that of the nickel base, so their addition increases the overall alloy density. For example, fourth generation alloys may be about 6% heavier than second generation alloys. The increased weight and cost of these alloys limit their use to only specialized applications. Third and fourth generation alloys are also limited by microstructural instabilities, which can impact long-term mechanical properties.

Each subsequent generation of alloys was developed in an effort to improve the creep strength and temperature capability of the prior generation. For example, third generation superalloys provide an improvement in creep capability of about 28° C. relative to second generation superalloys. Fourth and fifth generation superalloys offer a further improvement in creep strength achieved by high levels of solid solution strengthening elements such as rhenium, tungsten, tantalum, molybdenum and the addition of ruthenium.

The current alloys may have a good rupture property or a corrosion resistance. However, a superalloy with a balanced combination of rupture and corrosion resistance is lacking which hinders the part durability for certain applications.

Reference will now be made in detail to present embodiments of the disclosure, one or more examples of which are illustrated in the accompanying drawings. The detailed description uses numerical and letter designations to refer to features in the drawings. Like or similar designations in the drawings and description have been used to refer to like or similar parts of the disclosure.

The word "exemplary" is used herein to mean "serving as an example, instance, or illustration." Any implementation described herein as "exemplary" is not necessarily to be construed as preferred or advantageous over other implementations. Additionally, unless specifically identified otherwise, all embodiments described herein should be considered exemplary.

The term "at least one of" in the context of, e.g., "at least one of A, B, and C" refers to only A, only B, only C, or any combination of A, B, and C.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth.

As used herein, the term "substantially free" is understood to mean completely free of said constituent, or inclusive of trace amounts of same. "Trace amounts" are those quantitative levels of chemical constituent that are barely detectable and provide no benefit to the functional or aesthetic properties of the subject composition. The term "substantially free" also encompasses completely free.

Nickel-based superalloys are generally provided, including components formed from single crystal nickel-based superalloys (e.g., for turbine blade applications). Generally, the nickel-based superalloys have improved rupture strength, corrosion resistance, and oxidation resistance. The improvement balance of properties was achieved through balancing of the alloying elements.

It is believed that the exemplary embodiments disclosed herein provide a unique alloying approach for improved corrosion resistance, oxidation resistance and rupture resistant nickel-based superalloys. In particular embodiments, the composition exhibits a rupture life that is greater than 40 hours at 982.2° C. and 40 ksi, and wherein the composition exhibits a corrosion resistance of less than 50.8 μm attack at 926.7° C. after a 940 hour burner rig test.

Exemplary embodiments disclosed herein may include aluminum to promote oxidation resistance of the nickel-based superalloy. For example, the nickel-based superalloy may include 6.1 wt. % to 6.6 wt. % aluminum (e.g., 6.4 wt % to 6.6 wt % aluminum).

Exemplary embodiments disclosed herein may include tantalum to promote gamma prime strength of the nickel-based superalloy. For example, the nickel-based superalloy may include 5.6 wt. % to 6.6 wt. % tantalum (e.g., 5.6 wt % to 6.0 wt % tantalum).

Exemplary embodiments disclosed herein may include chromium to improve hot corrosion resistance of the nickel-based superalloy. For example, the nickel-based superalloy may include 9.0 wt. % to 11.0 wt. % chromium (e.g., 9.5 wt % to 10.5 wt % chromium).

Exemplary embodiments disclosed herein may include tungsten as a strengthener of the nickel-based superalloy. For example, the nickel-based superalloy may include 5.5 wt % to 6.2 wt. % tungsten (e.g., 5.8 wt % to 6.1 wt % tungsten).

Exemplary embodiments disclosed herein may include molybdenum to impart solid solution strengthening of the nickel-based superalloy. For example, the nickel-based superalloy may include 1.1 wt. % to 1.4 wt % molybdenum (e.g., 1.1 wt % to 1.3 wt % molybdenum).

Exemplary embodiments disclosed herein may include rhenium, which is a potent solid solution strengthener that partitions to the gamma phase of the nickel-based superalloy. Additionally, rhenium is also a slow diffusing element, which limits coarsening of the gamma prime. For example, the nickel-based superalloy may include 2.0 wt. % to 2.6 wt % rhenium (e.g., 2.1 wt % to 2.5 wt % rhenium).

Exemplary embodiments disclosed herein may include cobalt in the nickel-based superalloy. For example, the nickel-based superalloy may include 5.5 wt. % to 10.0 wt % cobalt (e.g., 5.5 wt % to 6.5 wt % cobalt).

Exemplary embodiments disclosed herein may optionally include hafnium, which improves the oxidation and hot corrosion resistance of the nickel-based superalloy. Hafnium may improve the life of thermal barrier coatings when applied thereon. For example, the nickel-based superalloy may include 0.2 wt % to 0.5 wt % hafnium.

Exemplary embodiments disclosed herein may include carbon in the nickel-based superalloy. For example, the nickel-based superalloy may include up to 0.05 wt % carbon (e.g., 0.03 wt % to 0.05 wt % carbon).

Exemplary embodiments disclosed herein may include boron to provide tolerance for low angle boundaries of the nickel-based superalloy. For example, the nickel-based superalloy may include 0.002 wt % to 0.01 wt % boron (e.g., 0.002 wt % to 0.006 wt % boron).

Through the totality of these particular composition concentrations of elements, the nickel-based superalloy has the improved oxidation resistance and rupture resistant nickel-based superalloys discussed above (e.g., a rupture life that is greater than 80 hours at 1093.3° C. and an oxidation resistance of less than 25.4 μm (i.e., 1 mil) surface loss at 1176.7° C. after a 400 hour Mach I test).

In one embodiment, the nickel-based superalloy includes 6.1 wt. % to 6.6 wt. % aluminum (e.g., 6.4 wt % to 6.6 wt % aluminum); 5.6 wt. % to 6.6 wt. % tantalum (e.g., 5.6 wt % to 6.0 wt % tantalum); 9.0 wt. % to 11.0 wt. % chromium (e.g., 9.5 wt % to 10.5 wt % chromium); 5.5 wt % to 6.2 wt. % tungsten (e.g., 5.8 wt % to 6.1 wt % tungsten); 1.1 wt. % to 1.4 wt % molybdenum (e.g., 1.1 wt % to 1.3 wt % molybdenum); 2.0 wt. % to 2.6 wt % rhenium (e.g., 2.1 wt % to 2.5 wt % rhenium); 5.5 wt. % to 10.0 wt % cobalt (e.g., 5.5 wt % to 6.5 wt % cobalt); 0.2 wt % to 0.5 wt % hafnium; up to 0.05 wt % carbon (e.g., 0.03 wt % to 0.05 wt % carbon); 0.002 wt % to 0.01 wt % boron (e.g., 0.002 wt % to 0.006 wt % boron); and a balance of nickel and incidental impurities.

In one embodiment, the nickel-based superalloy consists of 6.1 wt. % to 6.6 wt. % aluminum (e.g., 6.4 wt % to 6.6 wt % aluminum); 5.6 wt. % to 6.6 wt. % tantalum (e.g., 5.6 wt % to 6.0 wt % tantalum); 9.0 wt. % to 11.0 wt. % chromium (e.g., 9.5 wt % to 10.5 wt % chromium); 5.5 wt % to 6.2 wt. % tungsten (e.g., 5.8 wt % to 6.1 wt % tungsten); 1.1 wt. % to 1.4 wt % molybdenum (e.g., 1.1 wt % to 1.3 wt % molybdenum); 2.0 wt. % to 2.6 wt % rhenium (e.g., 2.1 wt % to 2.5 wt % rhenium); 5.5 wt. % to 10.0 wt % cobalt (e.g., 5.5 wt % to 6.5 wt % cobalt); 0.2 wt % to 0.5 wt % hafnium; up to 0.05 wt % carbon (e.g., 0.03 wt % to 0.05 wt % carbon); 0.002 wt % to 0.01 wt % boron (e.g., 0.002 wt % to 0.006 wt % boron); and a balance of nickel and incidental impurities.

Exemplary embodiments disclosed herein include a component, such as a blade, nozzle, a shroud, a splash plate, and a combustor of a gas turbine engine, comprising a substantially single crystal having a composition as described above. The use of exemplary superalloy compositions discussed herein is not limited to the gas turbine blade 10, and it may be employed in other components, particularly those components within a turbomachine, such as gas turbine nozzles, vanes, shrouds, or other components for gas turbine engines. The term "turbomachine" or "turbomachinery" refers to a machine including one or more compressors, a heat generating section (e.g., a combustion section), and one or more turbines that together generate a torque output. The term "gas turbine engine" refers to an engine having a turbomachine as all or a portion of its power source. Example gas turbine engines include turbofan engines, turboprop engines, turbojet engines, turboshaft engines, etc., as well as hybrid-electric versions of one or more of these engines.

Figure 2:
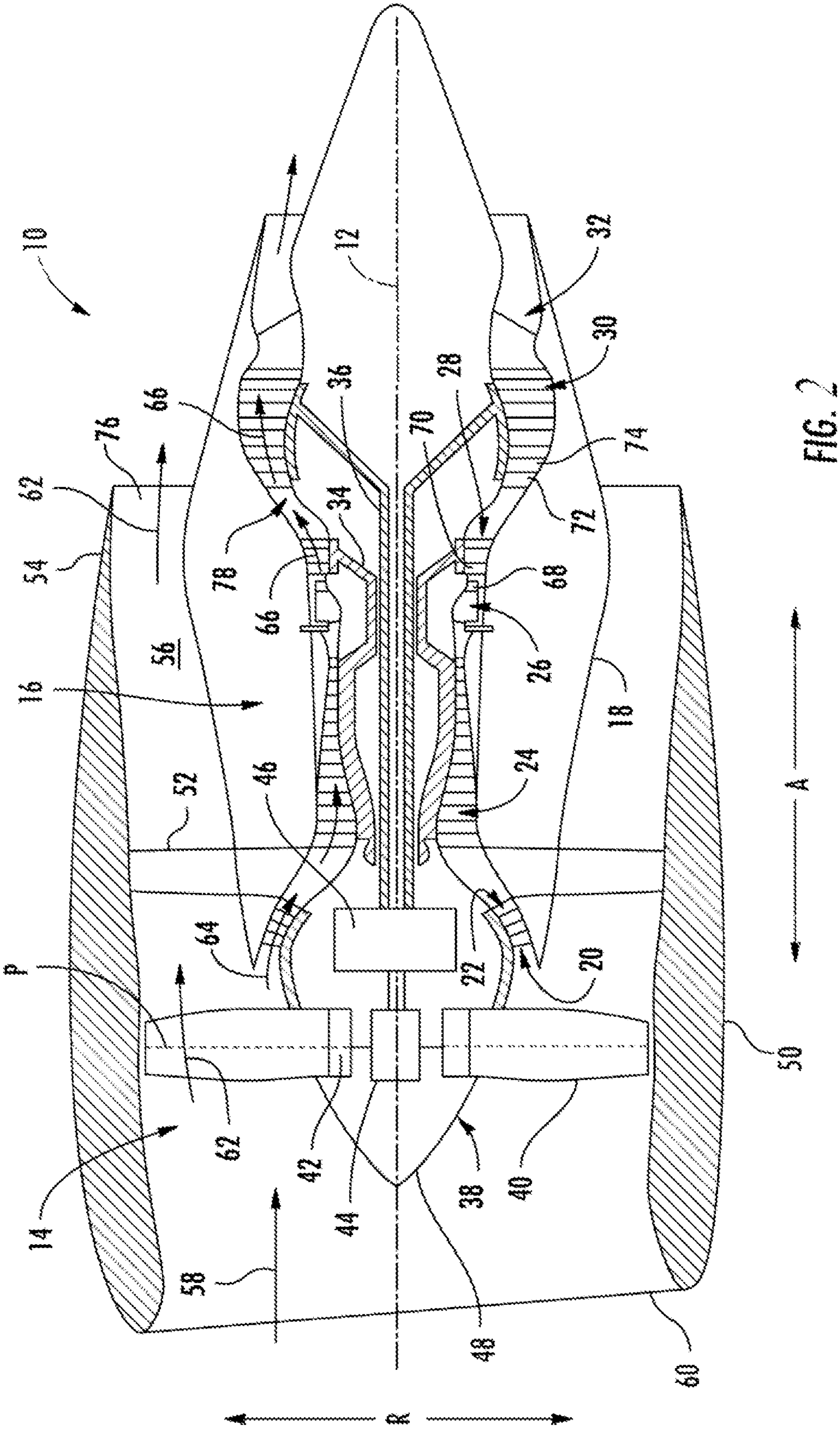
FIG. 2 is a schematic cross-sectional view of an exemplary gas turbine engine according to various embodiments of the present subject matter.

Referring to the drawings, FIG. 1 depicts a component 100 of a gas turbine engine, illustrated as a gas turbine blade. The component 100 includes an airfoil 120, a laterally extending platform 160, an attachment 140 in the form of a dovetail to attach the component 100 to a turbine disk (FIG. 2 discussed below). In some components, a number of cooling channels extend through the interior of the airfoil 120, ending in openings 180 in the surface of the airfoil 120.

In an exemplary embodiment, the component 100 is substantially a single crystal. That is, the component 100 is at least 80 percent by volume (vol. %), such as 80 vol. % to 100 vol. % (e.g., 95 vol. % to 100 vol. %), a single grain with a single crystallographic orientation. There may be minor volume fractions of other crystallographic orientations and also regions separated by low-angle boundaries. The single-crystal structure is prepared by the directional solidification of a superalloy composition, usually from a seed or other structure that induces the growth of the single crystal and single grain orientation.

FIG. 2 is a schematic cross-sectional view of a gas turbine engine in accordance with an exemplary embodiment of the present disclosure. More particularly, for the embodiment of FIG. 2, the gas turbine engine is a high-bypass turbofan engine 10, referred to herein as "turbofan engine 10." As shown in FIG. 2, the turbofan engine 10 defines an axial direction A (extending parallel to a longitudinal axis 12 provided for reference) and a radial direction R. In general, the turbofan engine 10 includes a fan section 14 and a core turbine engine 16 disposed downstream from the fan section 14. Although described below with reference to a turbofan engine 10, the present disclosure is applicable to turbomachinery in general, including turbojet, turboprop, and turboshaft gas turbine engines, including industrial and marine gas turbine engines and auxiliary power units. It is also applicable to other high temperature applications that contain water vapor in the gas phase, such as those arising from combustion of hydrocarbon fuels.

The exemplary core turbine engine 16 depicted generally includes a substantially tubular outer casing 18 that defines an annular inlet 20. The outer casing 18 encases, in serial flow relationship, a compressor section including a booster or low pressure (LP) compressor 22 and a high pressure (HP) compressor 24; a combustion section 26; a turbine section including a high pressure (HP) turbine 28 and a low pressure (LP) turbine 30; and a jet exhaust nozzle section 32. A high pressure (HP) shaft or spool 34 drivingly connects the HP turbine 28 to the HP compressor 24. A low pressure (LP) shaft or spool 36 drivingly connects the LP turbine 30 to the LP compressor 22.

For the embodiment depicted, the fan section 14 includes a variable pitch fan 38 having a plurality of fan blades 40 coupled to a disk 42 in a spaced apart manner. As depicted, the fan blades 40 extend outwardly from disk 42 generally along the radial direction R. Each fan blade 40 is rotatable relative to the disk 42 about a pitch axis P by virtue of the fan blades 40 being operatively coupled to a suitable actuation member 44 configured to collectively vary the pitch of the fan blades 40 in unison. The fan blades 40, disk 42, and actuation member 44 are together rotatable about the longitudinal axis 12 by LP spool 36 across an optional power gear box 46. The power gear box 46 includes a plurality of gears for stepping down the rotational speed of the LP spool 36 to a more efficient rotational fan speed.

Referring still to the exemplary embodiment of FIG. 2, the disk 42 is covered by rotatable front nacelle 48 aerodynamically contoured to promote an airflow through the plurality of fan blades 40. Additionally, the exemplary fan section 14 includes an annular fan casing or outer nacelle 50 that circumferentially surrounds the fan 38 and/or at least a portion of the core turbine engine 16. It should be appreciated that the nacelle 50 may be configured to be supported relative to the core turbine engine 16 by a plurality of circumferentially-spaced outlet guide vanes 52. Moreover, a downstream section 54 of the nacelle 50 may extend over an outer portion of the core turbine engine 16 so as to define a bypass airflow passage 56 therebetween.

During operation of the turbofan engine 10, a volume of air 58 enters the turbofan engine 10 through an associated inlet 60 of the nacelle 50 and/or fan section 14. As the volume of air 58 passes across the fan blades 40, a first portion of the air 58 as indicated by arrows 62 is directed or routed into the bypass airflow passage 56 and a second portion of the air 58 as indicated by arrow 64 is directed or routed into the LP compressor 22. The ratio between the first portion of air 62 and the second portion of air 64 is commonly known as a bypass ratio. The pressure of the second portion of air 64 is then increased as it is routed through the high pressure (HP) compressor 24 and into the combustion section 26, where it is mixed with fuel and burned to provide combustion gases 66.

The combustion gases 66 are routed through the HP turbine 28 where a portion of thermal and/or kinetic energy from the combustion gases 66 is extracted via sequential stages of HP turbine stator vanes 68 that are coupled to the outer casing 18 and HP turbine rotor blades 70 that are coupled to the HP shaft or spool 34, thus causing the HP shaft or spool 34 to rotate, thereby supporting operation of the HP compressor 24. The combustion gases 66 are then routed through the LP turbine 30 where a second portion of thermal and kinetic energy is extracted from the combustion gases 66 via sequential stages of LP turbine stator vanes 72 that are coupled to the outer casing 18 and LP turbine rotor blades 74 that are coupled to the LP shaft or spool 36, thus causing the LP shaft or spool 36 to rotate, thereby supporting operation of the LP compressor 22 and/or rotation of the fan 38.

The combustion gases 66 are subsequently routed through the jet exhaust nozzle section 32 of the core turbine engine 16 to provide propulsive thrust. Simultaneously, the pressure of the first portion of air 62 is substantially increased as the first portion of air 62 is routed through the bypass airflow passage 56 before it is exhausted from a fan nozzle exhaust section 76 of the turbofan engine 10, also providing propulsive thrust. The HP turbine 28, the LP turbine 30, and the jet exhaust nozzle section 32 at least partially define a hot gas path 78 for routing the combustion gases 66 through the core turbine engine 16.

Examples

Two exemplary nickel-based superalloys were prepared and compared to eight comparative nickel-based superalloys. The chemical composition of the exemplary superalloy and the eight comparative nickel-based superalloys, along with the resulting Rupture Life (in hours) and corrosion resistance (in depth), are shown in FIG. 3. As clearly seen in the testing results shown in FIG. 3, the two exemplary nickel-based superalloys led to increased rupture life and decreased corrosion.

As used herein, the "rupture life" is measured per ASTM E139-11.

As used herein, the "corrosion resistance" was determined using a burner rig test carried out at 926.7° C. (1700° F.) with the test pins of 3.3 mm in diameter and 38 mm in length exposed to an atmosphere generated from the combustion of a Jet A type of fuel containing 0.11 wt % (doped) sulfur with the injection of 3 ppm NaCl in the form of synthetic sea salt (ASTM-D1141) into the combustion stream. The test pins were machined from casting rods of target alloys. The fuel was combusted in the air to fuel ratios normally found in a gas turbine of approximately 30, and the resultant combustion product was flowed past the specimens at approximately 21.226 meters per second (70 feet per second) at 101.325 kPa (one atmosphere) pressure. The sample specimens subjected to these burner rig tests after designated hours (e.g., 940 hours for a 940 hour burner rig test) were sectioned, mounted and examined metallographically to determine the depth of penetration of the hot corrosion attack.

Further aspects are provided by the subject matter of the following clauses:

1. A nickel-based superalloy composition, comprising: 6.1 wt. % to 6.6 wt. % aluminum; 5.6 wt. % to 6.6 wt. % tantalum; 9.0 wt. % to 11.0 wt. % chromium; 5.5 wt % to 6.2 wt. % tungsten; 1.1 wt. % to 1.4 wt % molybdenum; 2.0 wt. % to 2.6 wt % rhenium; 5.5 wt. % to 10.0 wt % cobalt; 0.2 wt % to 0.5 wt % hafnium; up to 0.05 wt % carbon; 0.002 wt % to 0.01 wt % boron; and a balance of nickel and incidental impurities, wherein the nickel-based superalloy composition exhibits a rupture life that is greater than 40 hours at 982.2° C. and 40 ksi, and wherein the composition exhibits a corrosion resistance of less than 50.8 μm attack at 926.7° C. after a 940 hour burner rig test.
2. The nickel-based superalloy composition as in any preceding clause, comprising 6.4 wt % to 6.6 wt % aluminum.
3. The nickel-based superalloy composition as in any preceding clause, comprising 5.6 wt % to 6.0 wt % tantalum.
4. The nickel-based superalloy composition as in any preceding clause, comprising 9.5 wt % to 10.5 wt % chromium.
5. The nickel-based superalloy composition as in any preceding clause, comprising 5.8 wt % to 6.1 wt % tungsten.

6. The nickel-based superalloy composition as in any preceding clause, comprising 1.1 wt % to 1.3 wt % molybdenum.
7. The nickel-based superalloy composition as in any preceding clause, comprising 2.1 wt % to 2.5 wt % rhenium.
8. The nickel-based superalloy composition as in any preceding clause, comprising 5.5 wt % to 6.5 wt % cobalt.
9. The nickel-based superalloy composition as in any preceding clause, comprising 0.03 wt % to 0.05 wt % carbon.
10. The nickel-based superalloy composition as in any preceding clause, comprising 0.002 wt % to 0.006 wt % boron.
11. A nickel-based superalloy composition, consisting of: 6.1 wt. % to 6.6 wt. % aluminum; 5.6 wt. % to 6.6 wt. % tantalum; 9.0 wt. % to 11.0 wt. % chromium; 5.5 wt % to 6.2 wt. % tungsten; 1.1 wt. % to 1.4 wt % molybdenum; 2.0 wt. % to 2.6 wt % rhenium; 5.5 wt. % to 10.0 wt % cobalt; 0.2 wt % to 0.5 wt % hafnium; up to 0.05 wt % carbon; 0.002 wt % to 0.01 wt % boron; and a balance of nickel and incidental impurities, wherein the nickel-based superalloy composition exhibits a rupture life that is greater than 40 hours at 982.2° C. and 40 ksi, and wherein the nickel-based superalloy composition exhibits a corrosion resistance of less than 50.8 μm attack at 926.7° C. after a 940 hour burner rig test.
12. A component comprising the nickel-based superalloy of any preceding clause.
13. The component of any preceding clause, wherein the component comprises a single crystal of the nickel-based superalloy.
14. The component of any preceding clause, wherein the component comprises 80 vol. % to 100 vol. % of a single crystal of the nickel-based superalloy.
15. The component of any preceding clause, wherein the component is a gas turbine blade.
16. A component comprising 80 vol. % to 100 vol. % of a single crystal of a nickel-based superalloy composition, wherein the nickel-based superalloy composition comprises: 6.1 wt. % to 6.6 wt. % aluminum; 5.6 wt. % to 6.6 wt. % tantalum; 9.0 wt. % to 11.0 wt. % chromium; 5.5 wt % to 6.2 wt. % tungsten; 1.1 wt. % to 1.4 wt % molybdenum; 2.0 wt. % to 2.6 wt % rhenium; 5.5 wt. % to 10.0 wt % cobalt; 0.2 wt % to 0.5 wt % hafnium; up to 0.05 wt % carbon; 0.002 wt % to 0.01 wt % boron; and a balance of nickel and incidental impurities, wherein the component exhibits a rupture life that is greater than 40 hours at 982.2° C. and 40 ksi, and wherein the component exhibits a corrosion resistance of less than 50.8 nm attack at 926.7° C. after a 940 hour burner rig test.
17. The component of any preceding clause, wherein the component comprises 95 vol. % to 100 vol. % of the single crystal of the nickel-based superalloy.
18. The component of any preceding clause, wherein the component is a gas turbine blade.
19. The component of any preceding clause, wherein the nickel-based superalloy composition comprises: 6.4 wt % to 6.6 wt % aluminum; 5.6 wt % to 6.0 wt % tantalum; 9.5 wt % to 10.5 wt % chromium; 5.8 wt % to 6.1 wt % tungsten; 1.1 wt % to 1.3 wt % molybdenum; 2.1 wt % to 2.5 wt % rhenium; 5.5 wt % to 6.5 wt % cobalt; 0.03 wt % to 0.05 wt % carbon; and 0.002 wt % to 0.006 wt % boron.
20. The component of any preceding clause, wherein the nickel-based superalloy composition consists of: 6.1 wt. % to 6.6 wt. % aluminum; 5.6 wt. % to 6.6 wt. % tantalum; 9.0 wt. % to 11.0 wt. % chromium; 5.5 wt % to 6.2 wt. % tungsten; 1.1 wt. % to 1.4 wt % molybdenum; 2.0 wt. % to 2.6 wt % rhenium; 5.5 wt. % to 10.0 wt % cobalt; 0.2 wt % to 0.5 wt % hafnium; up to 0.05 wt % carbon; 0.002 wt % to 0.01 wt % boron; and a balance of nickel and incidental impurities This written description uses examples to disclose the present disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

We claim:

1. A nickel-based superalloy composition, comprising:
6.1 wt. % to 6.6 wt. % aluminum;
5.6 wt. % to 6.6 wt. % tantalum;
10.0 wt. % to 11.0 wt. % chromium;
5.5 wt % to 6.2 wt. % tungsten;
1.1 wt. % to 1.4 wt % molybdenum;
2.0 wt. % to 2.6 wt % rhenium;
5.5 wt. % to 10.0 wt % cobalt;
0.2 wt % to 0.5 wt % hafnium;
0.03 wt % to 0.05 wt % carbon;
0.002 wt % to 0.01 wt % boron; and
a balance of nickel and incidental impurities,
wherein the nickel-based superalloy composition exhibits a rupture life that is greater than 40 hours at 982.2° C. and 40 ksi, and wherein the nickel-based superalloy composition exhibits a corrosion resistance of less than 50.8 μm attack at 926.7° C. after a 940 hour burner rig test.

2. The nickel-based superalloy composition as in claim 1, comprising 6.4 wt % to 6.6 wt % aluminum.

3. The nickel-based superalloy composition as in claim 1, comprising 5.6 wt % to 6.0 wt % tantalum.

4. The nickel-based superalloy composition as in claim 1, comprising 10.0 wt. % to 10.5 wt % chromium.

5. The nickel-based superalloy composition as in claim 1, comprising 5.8 wt % to 6.1 wt % tungsten.

6. The nickel-based superalloy composition as in claim 1, comprising 1.1 wt % to 1.3 wt % molybdenum.

7. The nickel-based superalloy composition as in claim 1, comprising 2.1 wt % to 2.5 wt % rhenium.

8. The nickel-based superalloy composition as in claim 1, comprising 5.5 wt % to 6.5 wt % cobalt.

9. The nickel-based superalloy composition as in claim 1, comprising 0.002 wt % to 0.006 wt % boron.

10. A component comprising the nickel-based superalloy of claim 1.

11. The component of claim 10, wherein the component comprises a single crystal of the nickel-based superalloy.

12. The component of claim 10, wherein the component comprises 80 vol. % to 100 vol. % of a single crystal of the nickel-based superalloy.

13. The component of claim 10, wherein the component is a gas turbine blade.

14. A nickel-based superalloy composition, consisting of:
6.1 wt. % to 6.6 wt. % aluminum;

5.6 wt. % to 6.6 wt. % tantalum;
10.0 wt. % to 11.0 wt. % chromium;
5.5 wt % to 6.2 wt. % tungsten;
1.1 wt. % to 1.4 wt % molybdenum;
2.0 wt. % to 2.6 wt % rhenium;
5.5 wt. % to 10.0 wt % cobalt;
0.2 wt % to 0.5 wt % hafnium;
0.03 wt % to 0.05 wt % carbon;
0.002 wt % to 0.01 wt % boron; and
a balance of nickel and incidental impurities,
wherein the nickel-based superalloy composition exhibits a rupture life that is greater than 40 hours at 982.2° C. and 40 ksi, and wherein the nickel-based superalloy composition exhibits a corrosion resistance of less than 50.8 μm attack at 926.7° C. after a 940 hour burner rig test.

15. A component comprising 80 vol. % to 100 vol. % of a single crystal of a nickel-based superalloy composition, wherein the nickel-based superalloy composition comprises:
6.1 wt. % to 6.6 wt. % aluminum;
5.6 wt. % to 6.6 wt. % tantalum;
10.0 wt. % to 11.0 wt. % chromium;
5.5 wt % to 6.2 wt. % tungsten;
1.1 wt. % to 1.4 wt % molybdenum;
2.0 wt. % to 2.6 wt % rhenium;
5.5 wt. % to 10.0 wt % cobalt;
0.2 wt % to 0.5 wt % hafnium;
0.03 wt % to 0.05 wt % carbon;
0.002 wt % to 0.01 wt % boron; and
a balance of nickel and incidental impurities,
wherein the component exhibits a rupture life that is greater than 40 hours at 982.2° C. and 40 ksi, and wherein the component exhibits a corrosion resistance of less than 50.8 μm attack at 926.7° C. after a 940 hour burner rig test.

16. The component of claim 15, wherein the component comprises 95 vol. % to 100 vol. % of the single crystal of the nickel-based superalloy.

17. The component of claim 15, wherein the component is a gas turbine blade.

18. The component of claim 15, wherein the nickel-based superalloy composition comprises:
6.4 wt. % to 6.6 wt. % aluminum;
5.6 wt. % to 6.0 wt. % tantalum;
10.0 wt. % to 10.5 wt. % chromium;
5.8 wt % to 6.1 wt. % tungsten;
1.1 wt. % to 1.3 wt % molybdenum;
2.1 wt. % to 2.5 wt % rhenium;
5.5 wt. % to 6.5 wt % cobalt;
0.03 wt % to 0.05 wt % carbon; and
0.002 wt % to 0.006 wt % boron.

19. The component of claim 15, wherein the nickel-based superalloy composition consists of:
6.1 wt. % to 6.6 wt. % aluminum;
5.6 wt. % to 6.6 wt. % tantalum;
10.0 wt. % to 11.0 wt. % chromium;
5.5 wt % to 6.2 wt. % tungsten;
1.1 wt. % to 1.4 wt % molybdenum;
2.0 wt. % to 2.6 wt % rhenium;
5.5 wt. % to 10.0 wt % cobalt;
0.2 wt % to 0.5 wt % hafnium;
0.03 wt % to 0.05 wt % carbon;
0.002 wt % to 0.01 wt % boron; and
a balance of nickel and incidental impurities.

* * * * *